(12) United States Patent
Fukunaga et al.

(10) Patent No.: US 8,207,003 B2
(45) Date of Patent: Jun. 26, 2012

(54) METHOD OF MANUFACTURING GALLIUM NITRIDE-BASED COMPOUND SEMICONDUCTOR LIGHT-EMITTING DEVICE, GALLIUM NITRIDE-BASED COMPOUND SEMICONDUCTOR LIGHT-EMITTING DEVICE, AND LAMP

(75) Inventors: Naoki Fukunaga, Munakata (JP); Hiroshi Osawa, Chiba (JP)

(73) Assignee: Showa Denko K.K., Tokyo (JP)

( * ) Notice: Subject to any disclaimer, the term of this patent is extended or adjusted under 35 U.S.C. 154(b) by 0 days.

(21) Appl. No.: 12/297,989

(22) PCT Filed: Apr. 23, 2007

(86) PCT No.: PCT/JP2007/058727
§ 371 (c)(1),
(2), (4) Date: Oct. 21, 2008

(87) PCT Pub. No.: WO2007/125860
PCT Pub. Date: Nov. 8, 2007

(65) Prior Publication Data
US 2009/0090922 A1 Apr. 9, 2009

(30) Foreign Application Priority Data
Apr. 24, 2006 (JP) ................................. 2006-119207

(51) Int. Cl.
*H01L 21/00* (2006.01)
(52) U.S. Cl. ..................... 438/47; 237/94; 237/E21.002
(58) Field of Classification Search .............. 438/46–47; 257/E21.347, E21.475, E21.596, 94, E21.002, 257/E33.025
See application file for complete search history.

(56) References Cited

U.S. PATENT DOCUMENTS

| | | | |
|---|---|---|---|
| 7,081,401 B2 | 7/2006 | Lee et al. | |
| 2003/0178626 A1 | 9/2003 | Sugiyama et al. | |
| 2004/0206969 A1 | 10/2004 | Orita | |
| 2006/0024450 A1* | 2/2006 | Lin et al. ...................... | 427/554 |

FOREIGN PATENT DOCUMENTS

| | | |
|---|---|---|
| JP | 60-175314 A | 9/1985 |
| JP | 62-202419 A | 9/1987 |
| JP | 09-129919 A | 5/1997 |
| JP | 10-012060 A | 1/1998 |
| JP | 10-199346 A | 7/1998 |
| JP | 2000-031463 A | 1/2000 |

(Continued)

OTHER PUBLICATIONS

Japanese Patent [2005-244128], please reference to the Machine's Translation version.*

(Continued)

*Primary Examiner* — Tony Tran
(74) *Attorney, Agent, or Firm* — Sughrue Mion, PLLC

(57) ABSTRACT

Provided are a method of manufacturing a gallium nitride-based compound semiconductor light-emitting device with a low driving voltage (Vf) and high light outcoupling efficiency, a gallium nitride-based compound semiconductor light-emitting device, and a lamp. In the method of manufacturing the gallium nitride-based compound semiconductor light-emitting device, a transparent conductive oxide film 15 including a dopant is laminated on a p-type semiconductor layer 14 of a gallium nitride-based compound semiconductor device 1. The transparent conductive oxide film 15 is subjected to a laser annealing process using a laser after the lamination of the transparent conductive oxide film 15.

3 Claims, 2 Drawing Sheets

FOREIGN PATENT DOCUMENTS

| | | |
|---|---|---|
| JP | 2003-171783 A | 6/2003 |
| JP | 2003-218383 A | 7/2003 |
| JP | 2005-005679 A | 1/2005 |
| JP | 2005-197506 A | 7/2005 |
| JP | 2005-244128 A | 9/2005 |
| JP | 2005-244129 A | 9/2005 |
| JP | 2005-259970 A | 9/2005 |
| KR | 2003-0075747 A | 9/2003 |

OTHER PUBLICATIONS

Japanese Patent [2000-031463], please reference to the Machine's Translation version.*

Pissadakis (Journal of Applied Physics, vol. 95, No. 4).*

Hideo et al. (Excimer laser crystallization of amorphous indium-tin oxide thin films and application to fabrication of Bragg gratings.*

* cited by examiner

METHOD OF MANUFACTURING GALLIUM NITRIDE-BASED COMPOUND SEMICONDUCTOR LIGHT-EMITTING DEVICE, GALLIUM NITRIDE-BASED COMPOUND SEMICONDUCTOR LIGHT-EMITTING DEVICE, AND LAMP

TECHNICAL FIELD

The present invention relates to a method of manufacturing a gallium nitride-based compound semiconductor light-emitting device, and more particularly, to a method of manufacturing a gallium nitride-based compound semiconductor light-emitting device with a decreased driving voltage (Vf), a gallium nitride-based compound semiconductor light-emitting device, and a lamp.

This application claims priority based on Japanese Patent Application No. 2006-119207, filed on Apr. 24, 2006, the disclosure of which is incorporated herein by reference.

BACKGROUND ART

In recent years, as a semiconductor material for short wavelength light-emitting devices, a GaN-based compound semiconductor material, which is a nitride-based semiconductor material, has been spotlighted. A GaN-based compound semiconductor is formed on a substrate made of sapphire single crystals, various oxides, a group III-V compound or the like using metal organic chemical vapor deposition (MOCVD), molecular beam epitaxy (MBE) or the like.

One of the characteristics of a gallium nitride-based compound semiconductor light-emitting device is low current diffusion in a horizontal direction. Due to this characteristic, current is introduced into only a semiconductor right below an electrode and light emitted from a light-emitting layer is interrupted by the electrode, thereby making it difficult to output the light from the light-emitting layer to the outside. For the purpose of avoiding this, such a light-emitting device is typically configured to include a transparent electrode as a positive electrode through which light is output.

The transparent positive electrode is made of Ni/Au, ITO ($In_2O_3$—$SnO_2$) or the like, as is known in the art. Metal such as Ni/Au and the like has low contact resistance with a p-type semiconductor layer and low light transmittance. However, there is a problem in that although an oxide such as ITO has high light transmittance, it has high contact resistance.

There has been proposed a gallium nitride-based compound semiconductor light-emitting device including a positive electrode formed of a combination of a metal oxide layer having excellent conductivity, such as ITO or the like, and a contact metal layer (for example, see Patent Document 1, i.e. Japanese Patent Application Laid-Open No. Hei-9-129919).

However, in the gallium nitride-based compound semiconductor light-emitting device disclosed in Patent Document 1, although the contact metal layer used in the positive electrode lowers contact resistance with a p-type semiconductor layer, since the contact metal layer has low light transmittance, sufficient light output efficiency can not be obtained, which leads to low emission efficiency.

DISCLOSURE OF THE INVENTION

Problems to be Solved by the Invention

When a conductive oxide film such as ITO or the like is used as a positive electrode of a gallium nitride-based compound semiconductor light-emitting device, there is a method of subjecting the conductive oxide film to a thermal annealing process at a temperature of 300° C. or above in order to reduce specific resistance of the conductive oxide film. This thermal annealing process increases oxygen vacancies and hence carrier concentration in the conducive oxide film. The increase of the carrier concentration reduces the specific resistance of the conductive oxide film.

However, studies of the present inventor have shown that, when the thermal annealing process is subjected to the conductive oxide film at such high temperature, elements are interdiffused near an interface between the conductive oxide film and the p-type semiconductor layer, thereby preventing the specific resistance of the conductive oxide film from being reduced, as well as increasing the specific resistance of the p-type semiconductor layer and increasing the resistance of contact between the conductive oxide film and the p-type semiconductor layer. In particular, diffusion of a Ga element in the p-type semiconductor layer into the transparent conductive oxide file prevents the specific resistance and the contact resistance from being reduced.

To overcome the above problems, it is an object of the invention to provide a method of manufacturing a gallium nitride-based compound semiconductor light-emitting device with a decreased driving voltage (Vf) and high light outcoupling efficiency, a gallium nitride-based compound semiconductor light-emitting devices and a lamp.

Means for Solving the Problems

The present inventor has carefully reviewed the above problems and has made the present invention.

The present invention has the following constitutions,

A first aspect of the present invention is a method of manufacturing a gallium nitride-based compound semiconductor light-emitting device, in which a transparent conductive oxide film including a dopant is laminated on a p-type semiconductor layer of a gallium nitride-based compound semiconductor device, the method comprising the step of subjecting the transparent conductive oxide film to a laser annealing process using a laser.

A second aspect of the present invention is the method according to the first aspect wherein the laser annealing process includes the step of forming unevenness on a surface of the transparent conductive oxide film using an excimer laser.

A third aspect of the present invention is the method according to the first aspect or the second aspect, further including the step of subjecting the transparent conductive oxide film to a thermal annealing process at a range of temperature of 200 to 300° C. before and/or after the laser annealing process.

A fourth aspect of the present invention is the method according to any one of the first aspect to the third aspect, wherein the laser annealing process is performed using a KrF excimer laser or an ArF excimer laser as the excimer laser.

A fifth aspect of the present invention is the method according to any one of the first aspect to the fourth aspects wherein energy density of the excimer laser in the laser annealing process falls within a range of 50 to 1000 mJcm$^{-2}$.

A sixth aspect of the present invention is the method according to any one of the first aspect to the fourth aspect, wherein energy density of the excimer laser in the laser annealing process falls within a range of 50 to 300 mJcm$^{-2}$.

A seventh aspect of the present invention is the method according to any one of the first aspect to the sixth aspect, wherein the laser annealing process includes irradiating the transparent conductive oxide film with pulses within a range of 2 to 2000 times using an excimer laser.

An eighth aspect of the present invention is the method according to any one of the first aspect to the sixth aspect wherein the laser annealing process includes irradiating the transparent conductive oxide film with pulses with a range of 2 to 200 times using an excimer laser.

A ninth aspect of the present invention is a gallium nitride-based compound semiconductor light-emitting device obtained by a manufacturing method according to any one of the first aspect to the eighth aspect.

A tenth aspect of the present invention is a gallium nitride-based compound semiconductor light-emitting device, in which a transparent conductive oxide film including a dopant is laminated on a p-type semiconductor layer of a gallium nitride-based compound semiconductor device, wherein concentration of an element, which composes the p-type semiconductor layer, in the transparent conductive oxide film is 20 at % or below at a location within 2 nm from an interface between the transparent conductive oxide film and the p-type semiconductor layer.

An eleventh aspect of the present invention is a gallium nitride-based compound semiconductor light-emitting device, in which a transparent conductive oxide film including a dopant is laminated on a p-type semiconductor layer of a gallium nitride-based compound semiconductor device, wherein concentration of an element which composes the p-type semiconductor layer, in the transparent conductive oxide film is 20 at % or below at a location within 1 nm from an interface between the transparent conductive oxide film and the p-type semiconductor layer.

A twelfth aspect of the present invention is the gallium nitride-based compound semiconductor light-emitting device according to the tenth aspect or the eleventh aspect, wherein the transparent conductive oxide film is made of at least one selected from the group consisting of ITO, AZO, IZO, GZO, a ZnO-based conductor, and a $TiO_2$-based conductor.

A thirteenth aspect of the present invention is the gallium nitride-based compound semiconductor light-emitting device according to the twelfth aspect wherein the transparent conductive oxide film includes at least ITO.

A fourteenth aspect of the present invention is the gallium nitride-based compound semiconductor light-emitting device according to any one of the tenth aspect to the thirteenth aspect, wherein thickness of the transparent conductive oxide film falls within a range of 35 nm to 10 μm.

A fifteenth aspect of the present invention is the gallium nitride-based compound semiconductor light-emitting device according to any one of the tenth aspect to the thirteenth aspect, wherein thickness of the transparent conductive oxide film falls within a range of 100 nm to 1 μm.

A sixteenth aspect of the present invention is a lamp including a gallium nitride-based compound semiconductor light-emitting device according to any one of the ninth aspect to the fifteenth aspect.

The present inventor has found that, although specific resistance of a transparent conductive oxide film is increased when a Ga element in a p-type semiconductor layer is diffused into the transparent conductive oxide film, when a Ga element in the transparent conductive oxide film is segregated near an interface between the transparent conductive oxide film and the p-type semiconductor layer, contact resistance between the transparent conductive oxide form and the p-type semiconductor layer is reduced.

Accordingly, prevention of Ga from being diffused into the transparent conductive oxide film is effective in reducing the contact resistance between the transparent conductive oxide film and the p-type semiconductor layer.

Advantages of the Invention

According to the gallium nitride-based compound semiconductor light-emitting device manufacturing method of the present invention, the transparent conductive oxide film is laminated on the p-type semiconductor layer of the gallium nitride-based compound semiconductor device, and then the transparent conductive oxide film is subjected to the laser annealing process. Accordingly, it is possible to prevent the Ga element at the interface between the transparent conductive oxide film and the p-type semiconductor layer from being diffused, thereby reducing the specific resistance of the transparent conductive oxide film and hence the contact resistance between the transparent conductive oxide film and the p-type semiconductor layer, as compared to when only the ter annealing process is tied out.

Accordingly, it is possible to achieve a gallium nitride-based compound semiconductor light-emitting device with a low driving voltage (Vf) and high light emitting output.

Figure 1:
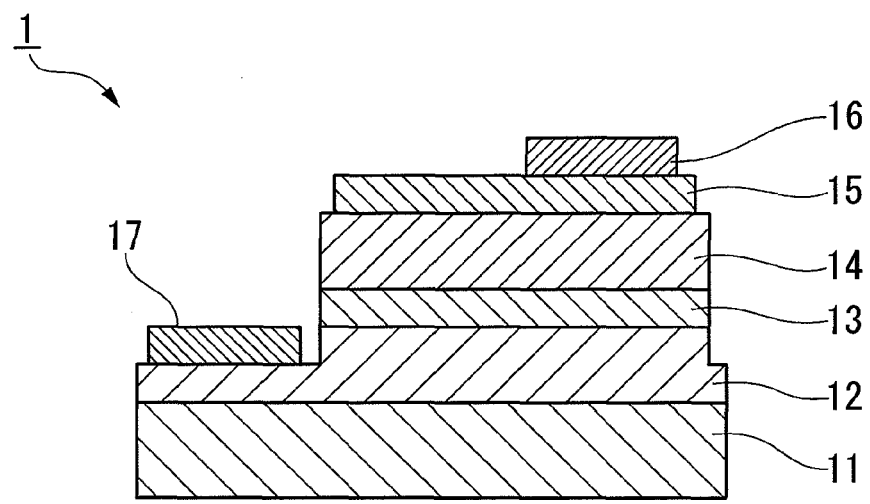
FIG. 1 is a schematic sectional view showing a gallium nitride-based compound semiconductor light-emitting device according to an embodiment of the present invention.

| Reference Numerals | |
|---|---|
| 1: | Gallium nitride-based compound semiconductor light-emitting device |
| 11: | Substrate |
| 12: | n-type semiconductor layer |
| 13: | Light-emitting layer |
| 14: | p-type semiconductor layer |
| 15: | Transparent conductive oxide layer |
| 16: | Positive electrode bonding pad |
| 17: | Negative electrode |
| 21: | Substrate |
| 22: | Undoped GaN underlayer |
| 23: | n-type GaN contact layer |
| 24: | n-type AlGaN clad layer |
| 25: | Light-emitting layer |
| 26: | p-type AlGaN clad layer |
| 27: | p-type GaN contact layer |
| 30: | Lamp |

BEST MODE FOR CARRYING OUT THE INVENTION

Hereinafter, a gallium nitride-based compound semiconductor light-emitting device and a lamp using the same according to an embodiment of the present invention will be described with reference to FIGS. 1 to 4.

The present invention is not limited to the following embodiment, but may encompass any combinations of components of the embodiment.

According to an embodiment of the present invention, a method of manufacturing a gallium nitride-based compound semiconductor light-emitting device, in which a transparent conductive oxide film including a dopant is laminated on a p-type semiconductor layer of a gallium nitride-based compound semiconductor device, includes the step of subjecting the transparent conductive oxide film to a laser annealing process using a laser after the lamination of the transparent conductive oxide film.

Hereinafter, a gallium nitride-based compound semiconductor light-emitting device obtained by the manufacturing method of the present invention will be described.

[Entire Configuration of Gallium Nitride-Based Compound Semiconductor Light-Emitting Device]

FIG. 1 is a schematic sectional view showing a gallium nitride-based compound semiconductor light-emitting device 1 (hereinafter sometimes abbreviated as a semiconductor light-emitting device) according to an embodiment of the present invention. In FIG. 1, reference numeral 11 denotes a substrate, reference numeral 12 denotes an n-type semiconductor layer, reference numeral 13 denotes a light-emitting layer, reference numeral 14 denotes a p-type semiconductor layer, reference numeral 15 denotes a transparent conductive oxide film, reference numeral 16 denotes a positive electrode bonding pad, and reference numeral 17 denotes a negative electrode.

According to the embodiment of the present invention, in the semiconductor light-emitting device 1, the substrate 11, the n-type semiconductor layer 12, the light-emitting layer 13, and the p-type semiconductor layer 14 are laminated in order. The transparent conductive oxide film 15 as a transparent positive electrode is laminated on the p-type semiconductor layer 14. The concentration of a Ga element, which composes the p-type semiconductor layer 14, in the transparent conductive oxide film 15 is preferably 20 at % or below in a range within 2 nm from an interface between the transparent conductive oxide film 15 and the p-type semiconductor layer 14, more preferably 20 at % or below in a range within 1 nm from the interface.

Hereinafter, the semiconductor light-emitting device 1 according to this embodiment will be described in more detail.

(Substrate)

As a material for the substrate 11, there have been widely known oxide single crystals such as a sapphire single crystal ($Al_2O_3$; face A, face C, face M and face R), a spinel single crystal ($MgAl_2O_4$), a ZnO single crystal, a $LiAlO_2$ single crystal, a $LiGaO_2$ single crystal, a MgO single crystal and the like, a Si single crystal, a SiC single crystal, a GaAs single crystal, a AlN single crystal, a GaN single crystal, boride single crystals such as a $ZrB_2$ single crystal and the like, etc.

In the present invention, any substrate materials including these known substrate materials may be used without any limitations. Among these materials, the sapphire single crystal and the SiC single crystal are particularly preferably used for the present invention.

A face orientation of the substrate is not particularly limited. The substrate may be a just substrate or a substrate with an off angle.

(Nitride-Based Compound Semiconductor)

On the substrate 11 are laminated the n-type semiconductor layer (n-type GaN layer) 12, the light-emitting layer 13 and the p-type semiconductor layer (p-type GaN layer) 14 in order with any known structure without any limitations. In particular, the p-type semiconductor layer may have a typical carrier concentration. For example, the transparent conductive oxide film may be laminated on the p-type semiconductor layer having a low carrier concentration, for example, $1 \times 10^{17}$ $cm^{-3}$ or so.

As nitride-base compound semiconductors, there have been known many nitride-based compound semiconductors expressed by, for example, the general formula $Al_XGa_YIn_ZN_{1-A}M_A$ ($0 \leq X \leq 1$, $0 \leq Y \leq 1$, $0 \leq Z \leq 1$, and X+Y+Z=1. Where, M represents a group V element other than nitrogen (N) and $0 \leq A < 1$). The present invention may use the nitride-based compound semiconductors expressed by the general formula $Al_XGa_YIn_ZN_{1-A}M_A$ ($0 \leq X \leq 1$, $0 \leq Y \leq 1$, $0 \leq Z \leq 1$, and X+Y+Z=1. Where, M represents a group V element other than nitrogen (N) and $0 \leq A < 1$) including these known nitride-based compound semiconductors without any limitations.

A method of growing a nitride-based compound semiconductor is not particularly limited but may be, for example, one of any nitride semiconductor growing methods known in the art, including MOCVD (Metal Organic Chemical Vapor Deposition), HVPE (Hydride Vapor Phase Epitaxy), MBE (Molecular Beam Epitaxy), etc. From the standpoint of film thickness controllability and yield, the MOCVD method is preferably used in the present invention.

In the MOCVD method, hydrogen ($H_2$) or nitrogen $N_2$) is used as a carrier gas, trimethyl gallium (TMG) or triethyl gallium (TEG) is used as a Ga source which is a group III group material, trimethyl aluminum (TMA) or triethyl aluminum (TEA) is used as an Al source, trimethyl indium (TMI) or triethyl indium (TEI) is used as an In source, and ammonium ($NH_3$) or hydrazine ($N_2H_4$) is used as an N source which is a group V material. In addition, for an n-type dopant, monosilane ($SiH_4$) or disilane ($Si_2H_6$) may be used as a Si material, and an organic germanium compound such as germane gas (GeH4), tetramethyl germanium (($CH_3)_4Ge$), tetraethyl germanium (($C_2H_5)_4Ge$) or the like may be used as a Ge material.

In the MBE method, a germanium element may be used as a doping source. For a p-type dopant, for example, biscyclopentadienyl magnesium ($Cp_2Mg$) or bisethylcyclopentadienyl magnesium ($EtCp_2Mg$) is used as a Mg material.

Figure 3:
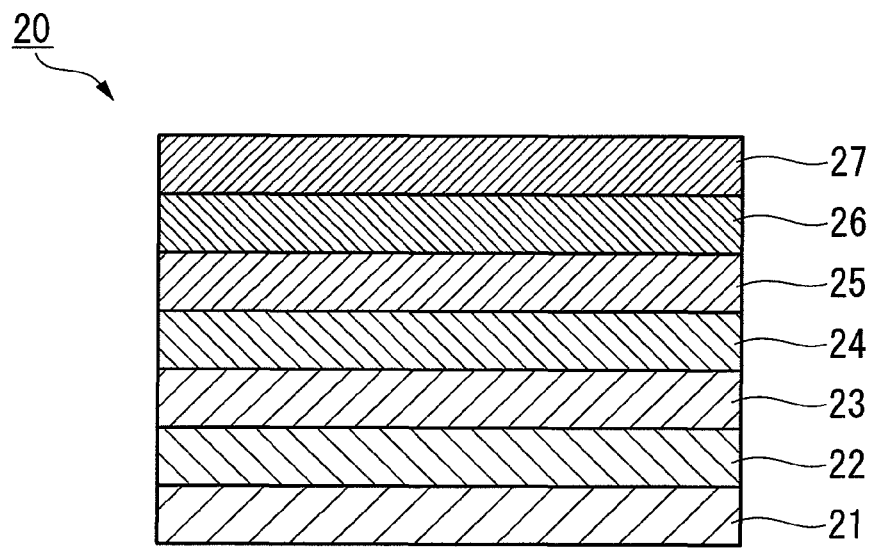
FIG. 3 is a sectional view showing a laminated structure of the gallium nitride-based compound semiconductor light-emitting device according to the embodiment of the present invention.

As an example of such a gallium nitride-based compound semiconductor, FIG. 3 shows a gallium nitride-based compound semiconductor 20 having a laminated structure. In the shown gallium nitride-based compound semiconductor 20, on a sapphire substrate 21 are laminated a buffer layer (not shown) made of AlN, a GaN underlayer 22, an n-type GaN contact layer 23, an n-type AlGaN clad layer 24, a light-emitting layer 25 made of InGaN, a p-type AlGaN clad layer 26 and a p-type GaN contact layer 27 in order.

In the gallium nitride-based compound semiconductor 20 shown in FIG. 3, by etching away some of the p-type GaN contact layer 27, the p-type AlGaN clad layer 26, the light-emitting layer 25 and the n-type AlGaN clad layer 24, a portion of the n-type GaN contact layer 23 is exposed. Thereafter, for example, a negative electrode made of Ti/Au is formed on the exposed portion of the n-type GaN contact layer 23 and a positive electrode (transparent conductive oxide film) is formed on the p-type GaN contact layer 27, thereby completing a gallium nitride-based compound semiconductor light-emitting device.

(Transparent Conductive Oxide Film)

The transparent conductive oxide film 15 is laminated at least on the p-type semiconductor layer (p-type GaN layer) 14. The positive electrode bonding pad 16 for connection with a circuit board or a lead frame is formed on a portion of the transparent conductive oxide film 15.

In the gallium nitride-based compound semiconductor light-emitting device of the present invention, as described above, the concentration of an element, which composes the p-type semiconductor layer, in the transparent conductive oxide film is preferably 20 at % or below, more preferably 10 at % or below, in a range within 2 nm from an interface between the transparent conductive oxide film and the p-type semiconductor layer. For example, in the semiconductor light-emitting device 1 shown in FIG. 1, the concentration of a Ga element, which composes the p-type semiconductor layer 14, in the transparent conductive oxide film 15 is preferably 20 at % or below in a range within 2 nm from an interface between the transparent conductive oxide film 15 and the p-type semiconductor layer 14, more preferably 20 at % or below in a range within 1 nm from the interface.

By setting the concentration of the element, which composes the p-type semiconductor layer, in the transparent conductive oxide film within the above-mentioned range, it is possible to reduce the specific resistance of the transparent conductive oxide film and further reduce the contact resistance between the p-type semiconductor layer and the transparent conductive oxide film. Thereby, it is possible to achieve a semiconductor light-emitting device with a low driving voltage (Vf).

Material used for the transparent conductive oxide film may be any material known in the art without any limitations. For example, material, such as ITO ($In_2O_3$—$SnO_2$), AZO (ZnO—$Al_2O_3$), IZO (ZnO—$In_2O_3$), GZO (ZnO—$Ga_2O_3$), $TiTaO_2$, $TiNbO_2$, or the like, having high transparency and high specific resistance is preferably used for the transparent conductive oxide film. In particular, in order to reduce a driving voltage (Vf), material containing ITO may be used for the transparent conductive oxide film since ITO has low specific resistance.

In case where AZO or GZO is used, since AZO or GZO has specific resistance higher than that of ITO, a driving voltage (Vf) becomes higher than the driving voltage (Vf) when ITO is used. However, when AZO or GZO is formed on GaN, since ZnO existing in MO or GZO epitaxially grown although ZnO has a grain boundary, AZO or GZO has better crystallization than ITO. Accordingly, AZO or GZO may provide a transparent conductive oxide film having less peeling and higher strength than ITO does.

In case where $TiTaO_2$ or $TiNbO_2$ is used for the transparent conductive oxide film, since a refractive index (2.6) of $TiO_2$ is substantially equal to that of GaN, it is possible to use $TiTaO_2$ or $TiNbO_2$ for the transparent conductive oxide film having high light outcoupling efficiency on GaN.

It is preferable to use a transparent conductive oxide film having composition near a dopant concentration to cause its specific resistance to become lowest. For example, when ITO is used for the transparent conductive oxide film, the concentration of Sn in ITO is preferably 5 to 20 wt %. In addition, in order to obtain low specific resistance, the concentration of Sn in ITO is preferably 7.5 to 12.5 wt %.

The thickness of the transparent conductive oxide film is preferably 35 nm to 10000 nm (10 μm) for high specific resistance and high transmittance. From the standpoint of product costs, the thickness of the transparent conductive oxide film is more preferably 1000 nm (1 μm) or below.

(Positive Electrode Bonding Pad and Negative Electrode)

The positive electrode bonding pad 16, which is formed on the transparent conductive oxide film 15, is made of Au, Al, Ni, Cu or the like with any known material and structure without any limitations.

The thickness of the positive electrode bonding pad 16 is preferably 100 to 1000 μm. Since a greater thickness of the bonding pad gives higher bondability on a characteristic of the bonding pad, the thickness of the positive electrode bonding pad 16 is preferably 300 nm or above. From the standpoint of production costs, the thickness of the positive electrode bonding pad 16 is preferably 500 nm or below.

The negative electrode 17 is formed on the n-type semiconductor layer 12 of the gallium nitride-based compound semiconductor in which the n-type semiconductor layer 12, the emitting layer 13 and the p-type semiconductor layer 14 are laminated on the substrate 11 in order.

On this account, when the negative electrode 17 is formed, the n-type semiconductor layer 12 is exposed by some of the light emitting layer 13 and the p-type semiconductor layer 14. In the present invention, the transparent conductive oxide film 15 is formed on the remaining p-type semiconductor layer 14 and then the negative electrode 17 is formed on the exposed n-type semiconductor layer 12.

The material for the negative electrode 17 may be any material known in the art with any structure without any limitations.

[Method of Manufacturing Gallium Nitride-Based Compound Semiconductor Light Emitting Device]

As described above, in the method of manufacturing the gallium nitride-based compound semiconductor light-emitting device, the transparent conductive oxide film 15 including a dopant is laminated on the p-type semiconductor layer 14 of the gallium nitride-based compound semiconductor device 1, as shown in FIG. 1. The method includes the step of subjecting the transparent conductive oxide film 15 to a laser annealing process using a laser after the lamination of the transparent conductive oxide film 15.

The transparent conductive oxide film 15 may be formed using any method known in the art, for example, a sputtering method, a vacuum deposition method, etc. However, when the transparent conductive oxide film is formed with ITO using the vacuum deposition method, since transmittance of ITO is low and a thermal annealing process at 600° C. is required, elements are diffused near au interface between the conductive oxide film and the p-type semiconductor layer, thereby making reduction of the specific resistance of the transparent conductive oxide film by a laser annealing process insufficient. Accordingly, for formation of the transparent conductive oxide film, it is preferable to use a film forming method such as a sputtering method or the like to further increase transmittance immediately after the film formation.

(Laser Annealing Process)

In the manufacturing method of the present invention, after laminating the transparent conductive oxide film 15 on the p-type semiconductor layer 14, the specific resistance of the transparent conductive oxide film 15 can be lowered by subjecting the transparent conductive oxide film 15 to a laser annealing process using a laser.

Subjecting the transparent conductive oxide film to the laser annealing process prevents diffusion of a Ga element at the interface between the thermally-annealed transparent conductive oxide film and the p-type semiconductor layer, thereby obtaining a transparent conductive oxide film having lower specific resistance as compared to when the transparent conductive oxide film is subjected to only the thermal annealing process. Accordingly, it is possible to obtain a semiconductor light-emitting device with reduced contact resistance between the p-type semiconductor layer and the transparent conductive oxide film.

A laser used for the laser annealing process in the manufacturing method of the present invention is preferably an excimer laser. The excimer laser may include, for example, a KrF excimer laser having a wavelength of 248 nm or an ArF excimer laser having a wavelength of 193 nm. By using the excimer laser having such a wavelength to perform the laser annealing process, it is possible to effectively reduce the specific resistance of the transparent conductive oxide film and further effectively reduce the contact resistance between the p-type semiconductor layer and the transparent conductive oxide film.

The transparent conductive oxide film such as ITO or the like transmits light in a visible range while nearly absorbing light having a wavelength of 300 nm or below. Accordingly, when the KrF excimer laser or the ArF excimer laser having a wavelength of less than 300 nm is used, since a laser beam is nearly absorbed in the transparent conductive oxide film in a range of energy density used for the laser annealing, it is possible to prevent Ga from being diffused without doing much damage to the p-type semiconductor layer by laser.

The energy density of the excimer laser used for the laser annealing process is preferably 50 mJcm$^{-2}$ to 1000 mJcm$^{-2}$ in order to reduce the specific resistance of the transparent conductive oxide film. This is because use of an excimer laser having an energy density of 1000 mJcm$^{-2}$ destroys crystallization of the transparent conductive oxide, film and hence deteriorates its conductivity. The energy density of the exciter laser is preferably 50 mJcm$^{-2}$ to 300 mJcm$^{-2}$ in order to prevent the Ga element from being diffused at the interface between the transparent conductive oxide film and the p-type semiconductor layer.

In the laser annealing process of the present invention, the exciter laser may irradiate the transparent conductive oxide film with a pulse.

If the excimer laser having high energy performs continuous irradiation on the transparent conductive oxide film, since laser energy absorbed in the p-type semiconductor layer becomes too large and thus Ga is diffused into the transparent conductive oxide film, a driving voltage (Vf) is increased. Accordingly, with a decrease of the energy of the excimer laser to a level low enough so as not substantially to increase the driving voltage (Vf), it is effective to irradiate the transparent conductive oxide film with a laser pulse while increasing the number of pulses. By increasing the number of pulses for laser irradiation, variations of laser energy of the pulses can be averaged, thereby achieving laser irradiation with little energy variation.

In the laser annealing process, when the excimer laser irradiates the transparent conductive oxide film with the pulses, the number of pulses is preferably 2 to 2000. At this time, the pulse width is preferably 5 to 100 ns.

When the pulse width and the number of pulses fall within the respective ranges when the excimer laser radiates the transparent conductive oxide film, the specific resistance of the transparent conductive oxide film is effectively reduced, thereby reducing the contact resistance between the p-type semiconductor layer and the transparent conductive oxide film while increasing light outcoupling efficiency of the semiconductor light-emitting device. In consideration of productivity, it is preferable to set the number of pulse irradiations of the excimer laser to be 2 to 200.

The beam size of the excimer laser is not particularly limited as long as it has no effect on the specific resistance of the transparent conductive oxide film. However, if the beam size is too large, a laser energy distribution may become deteriorated. Accordingly, for example, when an excimer laser having energy density of 50 mJcm$^{-2}$ to 300 mJcm$^{-2}$ is used, it is preferable to use the beam size of □1 mm×1 mm to □3 nm×3 mm.

In addition, in the manufacturing method of the present invention, the laser annealing process may include a step of forming unevenness on the transparent conductive oxide film 15 using the excimer laser.

By forming the unevenness, preferably random unevenness, on the surface of the transparent conductive oxide film 15, it is possible to increase light outcoupling efficiency, i.e., emission efficiency, of the gallium nitride-based compound semiconductor light-emitting device 1. In particular, it is possible to form the unevenness on the surface of the transparent conductive oxide layer without damaging the layer by plasma, as compared to when unevenness is formed on the surface of the transparent conductive oxide film using a dry etching apparatus or the like. In addition, in the laser annealing process of the present invention, it is possible to form unevenness having a size of 1 μm or below, which is difficult to be formed in a patterning process such as photolithography.

Accordingly, in the laser annealing process of the present invention, it is possible to carrying out two processes, i.e., the process of reducing the specific resistance of the transparent conductive oxide film and the process of forming the unevenness on the transparent conductive oxide film, simultaneously.

In addition, since the size of unevenness on the surface of the transparent conductive oxide film tends to increase as the energy density of the excimer laser becomes higher, it is preferable that the excimer laser having higher energy density irradiates the transparent conductive oxide film within an energy density as high as not to deteriorate conductivity of the transparent conductive oxide film in order to increase the light outcoupling efficiency. In particular, when the unevenness is formed such that a difference in height between its convex portion and its concave portion falls within a range of 35 nm to 2000 nm, it is effective in increasing light outcoupling efficiency. If the difference in height between its convex portion and its concave portion falls within a range of 100 nm to 500 nm, it is more effective in increasing light outcoupling efficiency.

When the p-type semiconductor layer 14 is directly irradiated with a laser beam, if energy of the excimer laser is large, crystallization of GaN composing the p-type semiconductor layer 14 may be deteriorated or a metal element in the p-type semiconductor layer 14 may be precipitated on the surface of the p-type semiconductor layer 14. Accordingly, it is preferable that the excimer laser irradiate only the surface of the transparent conductive oxide film 15.

In the manufacturing method of the present invention, by subjecting the transparent conductive oxide film to the above-described laser annealing process, for example, it is possible to obtain a semiconductor light-emitting device in which the concentration of a Ga element which composes the p-type semiconductor layer, in the transparent conductive oxide film is preferably 20 at % or below in a range within 2 nm from an interface between the transparent conductive oxide film and the p-type semiconductor layer, more preferably 20 at % or below in a range within 1 nm from the interface. By setting the concentration of the Ga element in the transparent conductive oxide film within the above-mentioned range, it is possible to reduce the specific resistance of the transparent conductive oxide film and further reduce the contact resistance between the p-type semiconductor layer and the transparent conductive oxide film. Thereby, it is possible to achieve a semiconductor light-emitting device with a decreased driving voltage (Vf).

(Thermal Annealing Process)

The gallium nitride-based compound semiconductor light-emitting device manufacturing method of the present invention may include a thermal annealing process of subjecting the transparent conductive oxide film 15 to a thermal annealing process at a range of 200 to 300° C. before and/or after the above-described laser annealing process. The thermal annealing process of the present invention is a process of thermally annealing the transparent conductive oxide film with means other than the laser annealing.

While the specific resistance of the transparent conducive oxide film is reduced by performing the above-described laser annealing process, its transmittance is lowered as compared to a transparent conductive oxide film subjected to only the thermal annealing process. Accordingly, when both of the laser annealing process and the thermal annealing process are performed, it is possible to obtain a transparent conductive oxide film with low specific resistance and high transmittance.

The thermal annealing process is performed at preferably a temperature of 300° C. or below, more preferably a temperature of 200 to 300° C., at which Ga is hardly diffused at the interface between the transparent conductive oxide film and the p-type semiconductor layer.

A process atmosphere in the thermal annealing process is preferably an oxygen ($O_2$)-containing atmosphere for the purpose of further increasing the transmittance of the transparent conductive oxide film, but the thermal annealing process may be performed in a nitrogen ($N_2$) atmosphere or a hydrogen ($H_2$) and nitrogen-mixed atmosphere where appropriate.

The thermal annealing process may be performed before and/or after the laser annealing process where appropriate.
[Configuration of Lamp]

The above-described gallium nitride-based compound semiconductor light-emitting device of the present invention may be used to construct a lamp with a transparent cover by any means known in the art, for example. In addition, a white lamp may be constructed by a combination of the gallium nitride-based compound semiconductor light-emitting device of the present invention and a cover having a fluorescent substance.

Figure 4:
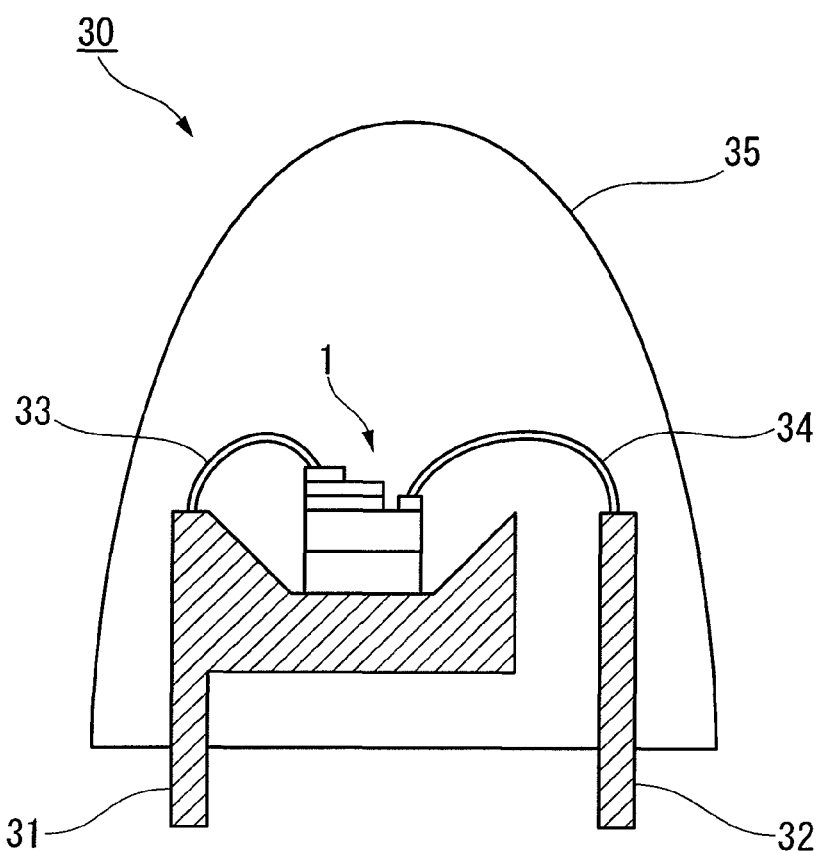
FIG. 4 is a schematic view showing a lamp constructed using a gallium nitride-based compound semiconductor light-emitting device according to an embodiment of the present invention.

For example, as shown in FIG. 4, the gallium nitride-based compound semiconductor light-emitting device of the present invention may be used to construct an LED lamp using any conventional known method without any limitations. Such a lamp may be of a general-purpose shell type, a side view type for portable backlight a top view type for display, etc.

For example, when a face-up type gallium nitride-based compound semiconductor light-emitting device is mounted on a shell type lamp, as shown in the figure, a gallium nitride-based compound semiconductor light-emitting device 1 is adhered to one of two frames 31 and 32 by means of resin or the like, and then a positive electrode bonding pad and a negative electrode bonding pad are bonded to the frames 31 and 32 by means of wires 33 and 34 made of material such as gold or the like, respectively. Thereafter, the device is molded with transparent resin (see a mold 35 in FIG. 4), thereby completing a shell type lamp 30.

Since the light-emitting device of the present invention has low driving voltage (Vf) and high light outcoupling efficiency, it is possible to realize a lamp with an excellent emission characteristic.

As described above, in the gallium nitride-based compound semiconductor light-emitting device manufacturing method of the present invention, the transparent conductive oxide film is laminated on the p-type semiconductor layer of the gallium nitride-based compound semiconductor device and then the transparent conductive oxide fun is subjected to the laser annealing process. Accordingly, since elements can be prevented from being diffused at the interface between the p-type semiconductor layer and the transparent conductive oxide film, as compared to when only the thermal annealing process is performed, it is possible to reduce the specific resistance of the transparent conductive oxide film and hence the contact resistance between the transparent conductive oxide film and the p-type semiconductor layer.

In addition, by forming the unevenness on the surface of the transparent conductive oxide film using the excimer laser, the light outcoupling efficiency can be increased.

In addition, by carrying out the thermal annealing process at the temperature of 200 to 300° C., at which an element contained in the p-type semiconductor layer is hardly diffused, before and/or after the laser annealing process, it is possible to increase the transmittance of the transparent conductive oxide film. Accordingly, it is possible to obtain a gallium nitride-based compound semiconductor light-emitting device with an excellent light output characteristic as compared to a gallium nitride-based compound semiconductor light-emitting device subjected to only the laser annealing process.

Accordingly, it is possible to obtain a gallium nitride-based compound semiconductor light-emitting device with a low driving voltage (Vf) and high light output.

EXAMPLES

Next, the light-emitting device and the lamp using the same according to the present invention will be described by way of examples without being limited thereto.

Experimental Example 1

Figure 2:
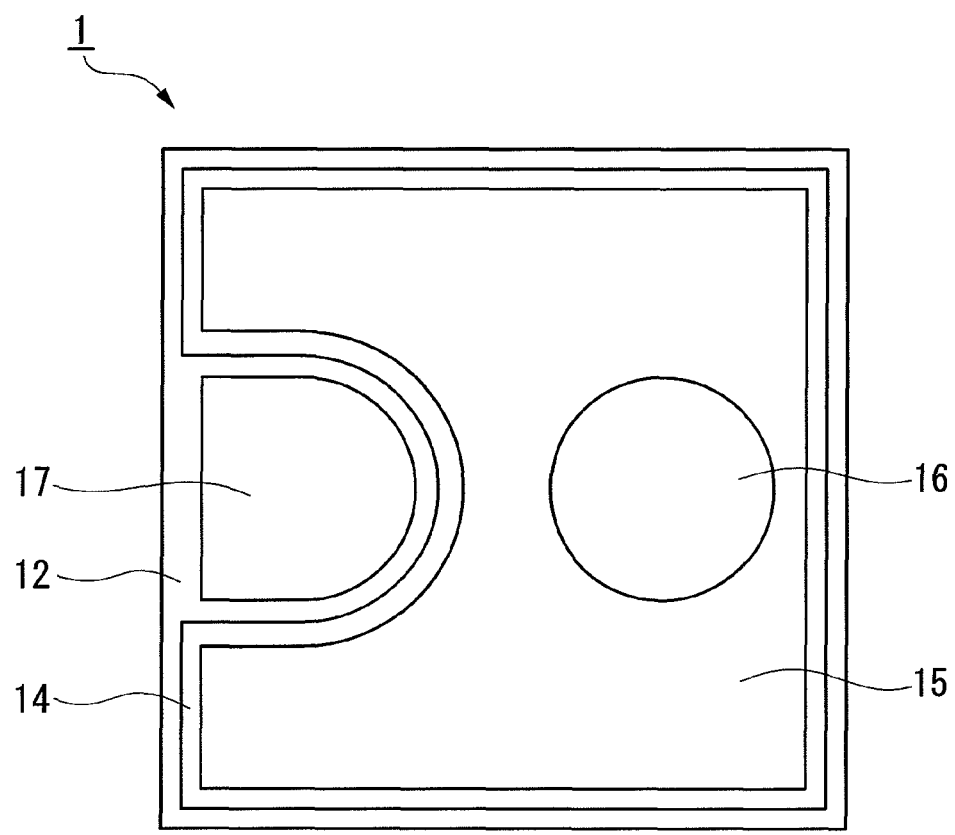
FIG. 2 is a schematic plan view showing a structure of the gallium nitride-based compound semiconductor light-emitting device according to the embodiment of the present invention.

FIG. 3 is a schematic sectional view showing an epitaxial structure manufactured to be used for a gallium nitride-based compound semiconductor light-emitting device in this Experimental Example. A description will be given in conjunction with FIGS. 1 and 2 showing a schematic sectional view and a schematic plan view of the gallium nitride-based compound semiconductor light-emitting device of the present invention, respectively.
(Manufacture of Gallium Nitride-Based Compound Semiconductor Light-Emitting Device)

A laminated structure of the gallium nitride-based compound semiconductor light-emitting device 20 was made by laminating an updoped GaN underlayer (layer thickness=2 µm) 22, a Si-doped n-type GaN contact layer (layer thickness=2 µm and carrier concentration=$1 \times 10^{19}$ cm$^{-3}$, a Si-doped n-type $Al_{0.07}Ga_{0.93}N$ clad layer (layer thickness=12.5 nm and carrier concentration=$1 \times 10^{18}$ cm$^{-3}$) 24, a light-emitting layer 23 having a multi-quantum structure including six Si-doped GaN barrier layers (layer thickness=14.0 nm and carrier concentration=$1 \times 10^{18}$ cm$^{-3}$) and five undoped $In_{0.20}Ga_{0.80}N$ well layers (layer thickness=2.5 nm) 25, a Mg-doped p-type $Al_{0.07}Ga_{0.93}N$ clad layer (layer thickess=10 nm) 26 and a Mg-doped p-type GaN contact layer (layer thickness=100 nm) 27 in order on a sapphire substrate 21 with a face C (crystal face (0001)) through an AlN buffer layer (not shown). Each layer 22 to 27 in the laminated structure of the gallium nitride-based compound semiconductor light-emitting device 20 was grown by means of typical reduced pressure MOCVD.

The epitaxial structure of the gallium nitride-based compound semiconductor light-emitting device 20 was used in a gallium nitride-based compound semiconductor light-emitting device (see FIG. 1). First, a surface of the p-type GaN contact layer 27 was cleaned using HF and HCl, and then, a transparent conductive oxide layer made of ITO was formed on the p-type GaN contact layer 27 by a sputtering method. ITO was formed at a layer thickness of about 250 nm by means of a DC magnetron sputter. For the sputter, using an ITO target with a $SnO_2$ concentration of 10 wt %, a pressure for formation of ITO was set to about 0.3 Pa.

After forming the transparent conductive oxide film made of ITO, the transparent conductive oxide film was subjected to a laser annealing process by irradiating the transparent conductive oxide film with one pulse (pulse width=20 ns) from a KrF excimer laser with energy density of 150 mJcm$^{-2}$. Thereafter, ITO was formed on only a region on the p-type GaN contact layer 27 in which a positive electrode is to be formed, by means of photolithography and wet etching known in the art.

In this manner, the transparent conductive oxide film of the present invention (see reference numeral 15 in FIGS. 1 and 2) was formed on the p-type GaN contact layer 27.

The positive electrode formed of the transparent conductive oxide film formed by the above-described method showed high transparency and a transmittance of 90% or above in a wavelength range of 460 nm. The transmittance was measured by a spectrophotometer using a sample for measurement of transmittance, which was made by laminating the transparent conductive oxide film having the same thickness on a glass plate. The transmittance was calculated in consideration of a light transmitting blank value measured for only the glass plate.

Next, a region in which an n-type electrode (negative electrode) is to be formed was subjected to a typical dry etching process in order to expose a surface of the Si-doped n-type GaN contact layer on only the region (see FIG. 1). Then, a positive electrode bonding pad (see reference numeral 16 in FIG. 1) and a negative electrode (see reference numeral 17 in FIG. 1) were formed by laminating a first layer made of Cr (layer thickness=40 nm), a second layer made of Ti (layer thickness=100 nm) and a third layer made of Au (layer thickness=400 nm) in order on a portion of the transparent conductive oxide film positive electrode) and the Si-doped n-type GaN contact layer 23.

After forming the positive electrode bonding pad and the negative electrode, a rear surface of the sapphire substrate was mirror-finished by polishing it using abrasive gains such as diamond grains or the like. Thereafter, the laminated structure was cut and separated into individual square chips having four sides of 350 pin, placed on a lead frame, and then connected to the lead frame via gold (Au) wires (Measurement of Driving Voltage (Vf) and Light Emitting Output (Po))

A forward voltage (driving voltage: Vf) measured for the obtained chips under application of current of 20 mA through electrical conduction by a probe needle was 3.3 V. It addition, it was confirmed that light emitting output (Po) measured using a typical integrating sphere was 10 mW, and a light emitting distribution of a light emitting plane had light emission at the entire surface of the transparent conductive oxide film.

(Calculation of Ga Concentration in ITO)

Through an EDX analysis of sectional TEM, Ga concentrations at locations 1 nm and 2 nm away from an interface between the p-type GaN contact layer 27 and the transparent conductive oxide film (positive electrode) to the transparent conductive oxide fin were estimated. The concentration of Ga in the transparent conductive oxide film was defined by a ratio (at %) between metal elements (In+Sn+Ga+Al) believed to exist near the interface in the transparent conductive oxide film. It was confirmed that the Ga concentrations in the transparent conductive oxide film were 10 at % and 6 at % in the locations of 1 nm and 2 nm, respectively, and Ga was less diffused than that in a semiconductor light-emitting device subjected to a thermal annealing process at 600° C. (Experimental Example 6 to be described later).

Experimental Example 2

A gallium nitride-based compound semiconductor light-emitting device was manufactured in the same way as Experimental Example 1 except that a laser annealing process was performed with energy density of the excimer laser set to 300 mJcm$^{-2}$.

Experimental Examples 3 and 4

A gallium nitride-based compound semiconductor light-emitting device was manufactured in the same way as Experimental Example 1 except that a laser annealing process was performed with the number of pulse irradiations of the excimer laser shown in the following Table 1.

Experimental Example 5

A gallium nitride-based compound semiconductor light-emitting device was manufactured in the same way as Experimental Example 1 except that a laser annealing process by the excimer laser was not performed.

Experimental Examples 6 and 7

A gallium nitride-based compound semiconductor light-emitting device was manufactured in the same way as Experimental Example 1 except that a thermal annealing process was performed at temperatures shown in Table 1 without performing a laser annealing process.

Experimental Examples 8 to 12

A gallium nitride-based compound semiconductor light-emitting device was manufactured in the same way as Experimental Example 1 except that a thermal annealing process was performed under conditions shown in Table 1 before or after the laser annealing process.

Experimental Example 13

A gallium nitride-based compound semiconductor light-emitting device was manufactured in the same way as Experimental Example 1 except that a thermal annealing process was performed at 250° C. in an $O_2$ atmosphere with energy density of the number of pulse irradiations of the excimer laser set to 150 mJcm$^{-2}$ and 20 (20 Hz), respectively.

Experimental Example 14

A gallium nitride-based compound semiconductor light-emitting device was manufactured in the same way as Experimental Example 1 except that a transparent conductive oxide film was formed using ITO by means of vacuum deposition.

Experimental Example 15

A gallium nitride-based compound semiconductor light-emitting device was manufactured in the same way as Experimental Example 1 except that a transparent conductive oxide film was formed using ITO by means of vacuum deposition and was not subjected to a laser annealing process.

Experimental Example 16

A gallium nitride-based compound semiconductor light-emitting device was manufactured in the same way as Experimental Example 1 except that a transparent conductive oxide film was formed using ITO by means of vacuum deposition and was subjected to a thermal annealing process at 600° C. without being subjected to a laser annealing process.

Experimental Example 17

A gallium nitride-based compound semiconductor light-emitting device was manufactured in the same way as Experimental Example 1 except that a transparent conductive oxide film was formed using ITO by means of vacuum deposition, subjected to a laser annealing process, and then subjected to a thermal annealing process at 600° C.

Experimental Example 18

A gallium nitride-based compound semiconductor light-emitting device was manufactured in the same way as Experimental Example 1 except that a transparent conductive oxide film was formed using AZO.

Experimental Example 19

A gallium nitride-based compound semiconductor light-emitting device was manufactured in the same way as Experimental Example 1 except that a transparent conductive oxide film was formed using AZO and was not subjected to a laser annealing process.

Experimental Example 20

A gallium nitride-based compound semiconductor light-emitting device was manufactured in the same way as Experimental Example 1 except that a transparent conductive oxide film was formed using AZO and was subjected to a thermal annealing process at 250° C. without being subjected to a laser annealing process.

Experimental Example 21

A gallium nitride-based compound semiconductor light-emitting device was manufactured in the same way as Experimental Example 1 except that a transparent conductive oxide film was formed using AZO, subjected to a laser annealing process, and then subjected to a thermal annealing process at 250° C.

Experimental Example 22

A gallium nitride-based compound semiconductor light-emitting device was manufactured in the same way as Experimental Example 1 except that a laser annealing process as performed using an ArF excimer laser.

Experimental Example 23

A gallium nitride-based compound semiconductor light-emitting device was manufactured in the same way as Experimental Example 1 except that a surface of a p-type GaN layer was irradiated by an excimer laser, a transparent conductive oxide film made of ITO was formed on the surface, and the transparent conductive oxide film was not subjected to a laser annealing process or thermal annealing process.

Experimental Example 24

A gallium nitride-based compound semiconductor light-emitting device was manufactured in the same way as Experimental Example 1 except that a transparent conductive oxide film was subjected to a thermal annealing process at 1001C.

Table 1 shows a list of formation conditions of the transparent conductive oxide films of Experimental Examples 1 to 24 and characteristics of the devices. In addition, Table 1 shows Ga concentrations at locations 1 nm and 2 nm away from an interface between a p-type GaN contact layer and a transparent conductive oxide film to the transparent conductive oxide film.

[Table 1]

TABLE 1

| | Material of Transparent conductive oxide film | Forming method | Excimer laser annealing | | | | Thermal annealing (1 min) | | Thickness of Transparent conductive oxide film | Device characteristic | | Ga density (at %) at a portion of 1 nm from an interface | Ga density (at %) at a portion of 2 nm from an interface |
|---|---|---|---|---|---|---|---|---|---|---|---|---|---|
| | | | Laser kind | Energy (mJcm$^{-2}$) | Pulse Number (times) | | Atmosphere | Temperature | | Driving voltage Vf (V) | Light emitting Output Po (mW) | | |
| Exp. Ex 1 | ITO | Sputter | KrF | 150 | 1 | | None | | 250 nm | 3.3 | 10 | 10 | 6 |
| Exp. Ex 2 | ITO | Sputter | KrF | 300 | 1 | | None | | 250 nm | 3.3 | 11 | 14 | 8 |
| Exp. Ex 3 | ITO | Sputter | KrF | 150 | 10 (10 Hz) | | None | | 250 nm | 3.2 | 10 | 10 | 7 |
| Exp. Ex 4 | ITO | Sputter | KrF | 150 | 20 (20 Hz) | | None | | 250 nm | 3.2 | 10 | 11 | 5 |
| Exp. Ex 5 | ITO | Sputter | | None | | | None | | 250 nm | 3.6 | 8 | 9 | 7 |
| Exp. Ex 6 | ITO | Sputter | | None | | | O$_2$ | 600° C. | 250 nm | 3.5 | 10 | 29 | 11 |
| Exp. Ex 7 | ITO | Sputter | | None | | | O$_2$ | 250° C. | 250 nm | 3.5 | 10 | 14 | 7 |
| Exp. Ex 8 | ITO | Sputter | KrF | 150 | 1 | | O$_2$ | 600° C. | 250 nm | 3.5 | 11 | 26 | 10 |
| Exp. Ex 9 | ITO | Sputter | KrF | 150 | 1 | | O$_2$ | 250° C. | 250 nm | 3.3 | 11 | 13 | 7 |
| Exp. Ex 10 | ITO | Sputter | KrF | 150 | 1 | | O$_2$(*1) | 250° C. | 250 nm | 3.3 | 11 | 11 | 6 |

TABLE 1-continued

| Material of Transparent conductive oxide film | Forming method | Excimer laser annealing | | | Thermal annealing (1 min) | | Thickness of Transparent conductive oxide film | Device characteristic | | Ga density (at %) at a portion of 1 nm from an interface | Ga density (at %) at a portion of 2 nm from an interface |
| | | Laser kind | Energy (mJcm$^{-2}$) | Pulse Number (times) | Atmosphere | Temperature | | Driving voltage Vf (V) | Light emitting Output Po (mW) | | |
|---|---|---|---|---|---|---|---|---|---|---|---|
| Exp. Ex 11 | ITO | Sputter | KrF | 150 | 1 | N$_2$ | 250° C. | 250 nm | 3.3 | 11 | 11 | 6 |
| Exp. Ex 12 | ITO | Sputter | KrF | 150 | 1 | N$_2$—1%H$_2$ | 250° C. | 250 nm | 3.3 | 11 | 12 | 7 |
| Exp. Ex 13 | ITO | Sputter | KrF | 150 | 20 (10 Hz) | O$_2$ | 250° C. | 250 nm | 3.2 | 12 | 10 | 4 |
| Exp. Ex 14 | ITO | Deposition | KrF | 150 | 1 | | None | 250 nm | 3.3 | 4 | 9 | 5 |
| Exp. Ex 15 | ITO | Deposition | None | | | | None | 250 nm | 3.6 | 4 | 10 | 5 |
| Exp. Ex 16 | ITO | Deposition | None | | | O$_2$ | 600° C. | 250 nm | 3.5 | 10 | 31 | 14 |
| Exp. Ex 17 | ITO | Deposition | KrF | 150 | 1 | O$_2$ | 600° C. | 250 nm | 3.5 | 11 | 34 | 15 |
| Exp. Ex 18 | AZO | Sputter | KrF | 150 | 1 | | None | 250 nm | 3.5 | 10 | 11 | 6 |
| Exp. Ex 19 | AZO | Sputter | None | | | | None | 250 nm | 3.8 | 7 | 9 | 4 |
| Exp. Ex 20 | AZO | Sputter | None | | | O$_2$ | 250° C. | 250 nm | 3.6 | 10 | 15 | 8 |
| Exp. Ex 21 | AZO | Sputter | KrF | 150 | 1 | O$_2$ | 250° C. | 250 nm | 3.5 | 11 | 14 | 8 |
| Exp. Ex 22 | ITO | Sputter | ArF | 150 | 1 | | None | 250 nm | 3.3 | 10 | 11 | 5 |
| Exp. Ex 23 | ITO | Sputter | None (Irradiation of p-type GaN layer with laser) | | | | None | 250 nm | 3.7 | 8 | — | — |
| Exp. Ex 24 | ITO | Sputter | KrF | 150 | 1 | O$_2$ | 100° C. | 250 nm | 3.3 | 10 | 11 | 7 |

(*1)Annealing process before laser annealing

Evaluation Results

As can be seen from evaluation results of device characteristics shown in Table 1, for the gallium nitride-based compound semiconductor light-emitting device of Experimental Example 1 which was subjected to a laser annealing process by irradiating the transparent conductive oxide film with the KrF excimer laser of 150 mJcm$^{-2}$ once, the driving voltage (Vf) was 3.3 V and the light emitting output (Po) was 10 mW. The Ga concentration at the location within 2 nm from the interface of the p-type GaN and the ISO layer to the ITO layer was 10% or below. From this, similar to when no laser annealing process was performed like the semiconductor light-emitting device of Experimental Example 5, it can be seen that the Ga concentration becomes low and Vf becomes low as compared to when the thermal annealing process was performed without performing the laser annealing process like the semiconductor light-emitting device of Experimental Example 6.

In addition, like the semiconductor light-emitting devices of Experimental Examples 2 to 4, when the energy density or the number of pulse irradiations of the excimer laser are changed, a difference between device characteristics is shown. In Experimental Example 2 with irradiation of the excimer laser of the energy density of 300 mJcm$^{-2}$, since roughness (difference in height between a convex portion and a concave portion) of the surface of ITO is large, the light outcoupling efficiency and Po are high. In Experimental Examples 3 and 4 with irradiation of the excimer laser with the number of pluses of 10 and 20, Vf is smaller than that for the number of pulses of 1.

Like the semiconductor light-emitting device of Experimental Example 7, when the thermal annealing process is performed at 300° C. or below (250° C.) without performing the laser annealing process, the Ga concentration at the location within 2 nm from the interface of the p-type GaN and the ISO layer to the ITO layer was 14% or below. In this case, since the specific resistance of ITO is not sufficiently reduced while preventing Ga from being diffused into ITO, Vf is 3.5 V.

In the semiconductor light-emitting devices of Experimental Examples 8 to 12 subjected to both of the laser annealing process and the thermal annealing process, since the transmittance of ITO is increased by the thermal annealing process, the light emitting output is high as compared to when only the laser annealing process is performed with Po of 11 mW. Among these Experimental Examples, the Ga concentration in ITO is increased only in Experimental Example 8 subjected to the thermal annealing process at 600° C., which provides a characteristic having higher Vf (—3.5 V) than that in Experimental Example 1 and so on subjected to only the laser annealing process. On the other hand, like Experimental Examples 9 to 12, when the thermal annealing process is performed at 250° C., the Ga concentration in ITO is low and Vf is small without depending on an atmosphere in the thermal annealing.

In addition, although the thermal annealing process is performed in only Experimental Example 10 before the laser annealing process, this Example 10 shows the same Vf(=3.3 V) and Po (=11 mW) as Experimental Example 9 subjected to the thermal annealing process after the laser annealing process.

In the semiconductor device of Experimental Example 13 with the number of pulse irradiations of 20 of the excimer laser, a good characteristic of Vf of 3.2 V and Po of 12 mW is obtained. It can be seen that it is possible to obtain a device with low Vf and high Po by combining the laser annealing process and the thermal annealing process at 3000° C. or below (250° C.).

In addition, in the semiconductor light-emitting devices of Experimental Examples 14 to 17 using the vacuum deposition to form ITO, since the transmittance of ITO is extremely low, Experimental Examples 14 and 15 subjected to no thermal annealing process show very low Po of 4 mW. In Experimental Example 16 subjected to only the thermal annealing process at 600° C. in order to increase the transmittance of ITO, Vf is 3.5 V and Po is 10 mW, thereby improving a device characteristic. In addition, in Experimental Example 17 subjected to both of the laser annealing process and the thermal annealing process, Vf is 3.5 V and Po is 11 mV.

Wen the transparent conductive oxide film of ITO is formed using the vacuum deposition, although the thermal annealing process at 600° C. is required to increase the transmittance, since the Ga concentration in ITO is increased in Experimental Examples 16 and 17 prepared in this manner, it can be seen that Vf is increased as compared to when ITO is formed using a sputtering method.

In the semiconductor light-emitting devices of Experimental Examples 18 to 21 in which the transparent conductive oxide film of AZO is formed, like formation of ITO, Vf in Experimental Examples 18 and 21 is lower than that in Experimental Examples 19 and 20 subjected to no laser annealing process. However, since the specific resistance of AZO is higher ha that of ITO, Vf in Experimental Examples 18 to 21 in which AZO is formed is even higher than that in Experimental Example 1 and so on in which ITO is formed.

In the semiconductor light-emitting device of Experimental Example 22 subjected to the laser annealing process using the ArF excimer laser, Vf is 3.3 V and Po is 10 mW, thereby obtaining a device characteristic like the KrF excimer laser.

In the semiconductor light-emitting device of Experimental Example 23 subjected to the laser annealing process before forming ITO on the p-type GaN layer, Vf is very high as 3.7 V. It can be seen from this that laser irradiation on the p-type GaN layer increases Vf. In addition, in Experimental Example 23, since ITO is subjected to no laser annealing process and no thermal annealing process, a device characteristic of low Po of 8 mW is obtained.

In the semiconductor light-emitting device of Experimental Example 24 subjected to the thermal annealing process at 100° C., Vf is 3.3 V and Po is 10 mW.

From the above results, it is apparent that the gallium nitride-based compound semiconductor light-emitting device obtained according to the manufacturing method of the present invention has excellent device characteristics such as high light outcoupling efficiency and a low driving voltage (Vf).

INDUSTRIAL APPLICABILITY

The present invention can be applied to a method of manufacturing a gallium nitride-based compound semiconductor light-emitting device, and more particularly, to a method of manufacturing a gallium nitride-based compound semiconductor light-emitting device with a decreased driving voltage (Vf), a gallium nitride-based compound semiconductor light-emitting device, and a lamp.

The invention claimed is:

1. A method of manufacturing a gallium nitride-based compound semiconductor light-emitting device, in which a transparent conductive oxide film including a dopant is laminated on a p-type semiconductor layer of a gallium nitride-based compound semiconductor device, the method comprising the step of subjecting the transparent conductive oxide film to a laser annealing process using an excimer laser, and the step of subjecting the transparent conductive oxide film to a thermal annealing process at a range of temperature of 200 to 250° C., wherein energy density of the excimer laser in the laser annealing process falls within a range of 150 to 300 mJcm$^{-2}$, the p-type semiconductor layer comprises Ga, and the transparent conductive oxide film contains Ga in a concentration of 20 atoms % or below at a location within 1 nm from the interface between the transparent conductive oxide film and the p-type semiconductor layer, and the laser annealing process includes the step of forming unevenness on a surface of the transparent conductive oxide film using an excimer laser.

2. The method according to claim 1, wherein the laser annealing process is performed using a KrF excimer laser or an ArF excimer laser as the excimer laser.

3. The method according to claim 1, wherein the laser annealing process includes irradiating the transparent conductive oxide film with pulses within a range of 1 to 20 times using an excimer laser.

* * * * *